US008779531B2

(12) United States Patent
Mantese et al.

(10) Patent No.: US 8,779,531 B2
(45) Date of Patent: Jul. 15, 2014

(54) TWO-WAFER MEMS IONIZATION DEVICE

(75) Inventors: Joseph V. Mantese, Ellington, CT (US); Antonio M. Vincitore, South Windsor, CT (US)

(73) Assignee: UTC Fire & Security Corporation, Farmington, CT (US)

( * ) Notice: Subject to any disclaimer, the term of this patent is extended or adjusted under 35 U.S.C. 154(b) by 13 days.

(21) Appl. No.: 13/338,425

(22) Filed: Dec. 28, 2011

(65) Prior Publication Data

US 2013/0168781 A1 Jul. 4, 2013

(51) Int. Cl.
*H01L 27/14* (2006.01)

(52) U.S. Cl.
USPC ........... 257/414; 257/254; 257/415; 257/419; 257/E29.166; 257/E21.002

(58) Field of Classification Search
USPC .................. 257/254, 414, 415, 419, E29.166, 257/E21.002; 438/49
See application file for complete search history.

(56) References Cited

U.S. PATENT DOCUMENTS

| | | | | |
|---|---|---|---|---|
| 4,075,487 | A | 2/1978 | Larsen | |
| 6,743,656 | B2 | 6/2004 | Orcutt et al. | |
| 6,809,413 | B1 | 10/2004 | Peterson et al. | |
| 2006/0251543 | A1 | 11/2006 | Koratkar et al. | |
| 2011/0014572 | A1* | 1/2011 | Lal | 430/296 |

FOREIGN PATENT DOCUMENTS

| | | | |
|---|---|---|---|
| DE | 19800555 | A1 | 7/1999 |
| EP | 1058286 | A1 | 12/2000 |
| GB | 2460729 | A | 12/2009 |
| JP | 2006120585 | A | 5/2006 |
| WO | WO2012091715 | A1 | 7/2012 |

OTHER PUBLICATIONS

Kalem S et al., "Black Silicon With High Density and High Aspect Ratio Nanowhiskers", Nanotechnology, IOP, Bristol, GB, vol. 22, No. 23, Apr. 12, 2011, 8 pages.

PCT Invitation to Pay Additional Fees and, Where Applicable, Protect Fee and Communication Relating to the Results of the Partial Internatinal Search for International Application No. PCT/US2012,071176, Apr. 10, 2013, 10 pages.

PCT International Search Report and Written Opinion of the International Searching Authority for International Application No. PCT/US2012/071176, Jun. 20, 2013, 19 pages.

* cited by examiner

*Primary Examiner* — Michelle Mandala
(74) *Attorney, Agent, or Firm* — Cantor Colburn LLP

(57) ABSTRACT

A microelectromechanical system (MEMS) assembly includes at least one emission source; a top wafer having a plurality of side walls and a generally horizontal portion, the horizontal portion having a thickness between a first side and a directly opposed second side, at least one window in the horizontal portion extending between the first and second sides and a transmission membrane across the at least one window; and a bottom wafer having a first portion with a first substantially planar surface, an intermediate surface directly opposed to the first substantially planar surface, a second portion with a second substantially planar surface, the at least one emission source provided on the second substantially planar surface; where the top wafer bonds to the bottom wafer at the intermediate surface and encloses a cavity within the top wafer and the bottom wafer.

11 Claims, 7 Drawing Sheets

TWO-WAFER MEMS IONIZATION DEVICE

FIELD OF INVENTION

The subject matter disclosed herein relates generally to the field of micro-electromechanical systems (MEMS), and more particularly, to a MEMS based ionization device and a process for manufacturing the MEMS based ionization source that uses two-silicon wafers having an electron transmission window.

DESCRIPTION OF RELATED ART

There are a variety of detectors that rely upon ionization. For example, ionization is used to ionize gas molecules for detecting the presence of a particular gas or substance. Smoke detectors, for example, provide an indication of the presence of smoke to alarm individuals regarding a fire condition.

Conventional detectors have utilized ionization of a fluid, such as air, for detecting the presence of smoke or another gas or substance of interest. Ionization detectors typically include a source of alpha particles such as Americium 241 for ionizing air. The alpha particles ionize air within a detection chamber. The amount of ionization varies depending on the contents of the detection chamber. When particles of smoke or another substance of interest enter the detection chamber, the particles interacts with the ions and alter the ion concentration and distribution within the chamber compared to when only air is present in that chamber. Such a change in ionization is used for providing an indication of the presence of smoke, other gas, or substance of interest. This can be detected, for example, by measuring the voltage or current at a collector electrode of the detector.

One drawback associated with known detectors is that they include a radioactive material within the ionization source. Another drawback is that the source of radioactive particles does not provide a consistent or tunable energy level. One suggestion for avoiding radioactive materials within an ionization source is to use soft x-rays for ionization. There are challenges associated with realizing an x-ray source for such purposes that fits within the miniaturized electronics requirements for many detector applications. Improvements in providing MEMS devices with non-radiation ionization sources that overcome the previously delineated drawbacks would be well received in the art.

BRIEF SUMMARY

According to one aspect of the invention, a microelectromechanical system (MEMS) assembly includes at least one emission source, a top wafer, and a bottom wafer. The top wafer includes a plurality of side walls and a generally horizontal portion. The horizontal portion has a thickness between a first side and a directly opposed second side. The horizontal portion also includes at least one window extending between the first and second sides and a transmission membrane across the at least one window. Also, the bottom wafer has a first portion with a first substantially planar surface, an intermediate surface directly opposed to the first substantially planar surface, a second portion with a second substantially planar surface, and at least one emission source provided on the second substantially planar surface. Also, the top wafer bonds to the bottom wafer at the intermediate surface and encloses a cavity within the top wafer and the bottom wafer.

According to another aspect of the invention, a method of forming a microelectromechanical system (MEMS) device having emission sources includes forming a bottom wafer having the emission sources including forming an ionization region in the bottom wafer. The ionization region is formed by etching at least one cavity in the ionization region and subjecting the ionization region to an anisotropic etching process to form the emission sources. The method also includes forming a top wafer of silicon including forming a plurality of side walls and a generally horizontal portion. The generally horizontal portion has a thickness between a first side and a directly opposed second side, at least one window in the horizontal portion extending between the first and second sides, and a transmission membrane across the at least one window. The method includes attaching the top wafer to the bottom wafer and enclosing a cavity between the top wafer and the bottom wafer.

Other aspects, features, and techniques of the invention will become more apparent from the following description taken in conjunction with the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Embodiments of a method for manufacturing the MEMS based ionization source from two-silicon wafers is described herein. In an embodiment, a two-wafer approach includes a bottom wafer having a plurality of emission sources and a top wafer having a transmission membrane for receiving the electrons emitted from nano-emitters in the emission sources. The top wafer and the bottom wafer are bonded together along an insulation layer that provides a stand-off voltage between the emission sources and the target membrane. Also, a DC voltage is applied to the nano-emitters for emission of electrons that accelerate through a cavity separating the top wafer and the bottom wafer and reception at the transmission membrane. In another embodiment, a MEMS based ionization source may be manufactured from single silicon using a sacrificial dielectric layer as the bottom wafer having the emission sources.

Figure 1:
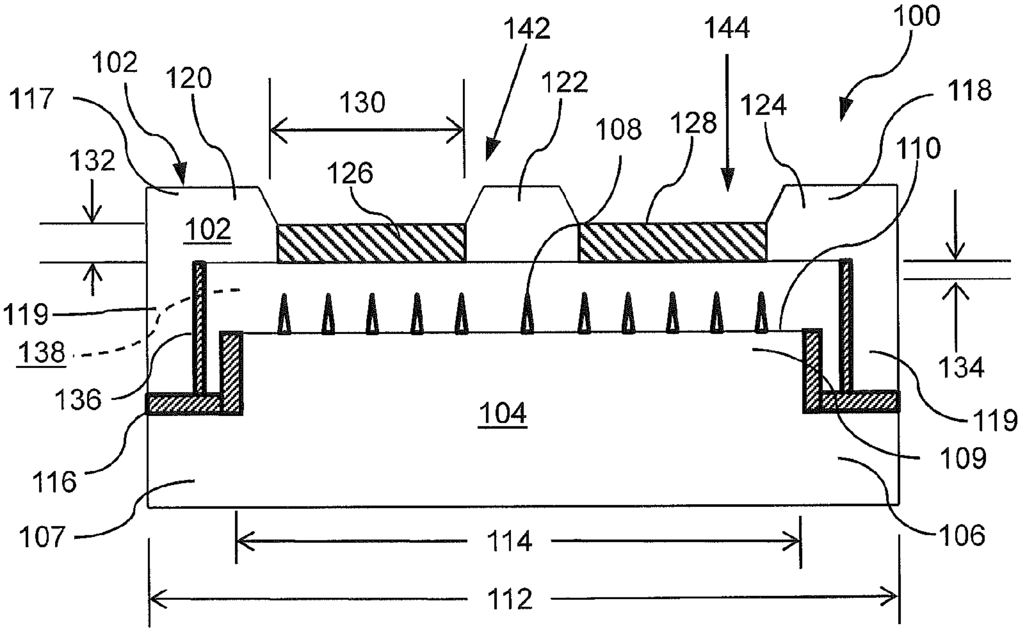
FIG. 1 illustrates a cross-sectional view of a MEMS semiconductor structure that can be implemented within embodiments of the invention.
Figure 2:
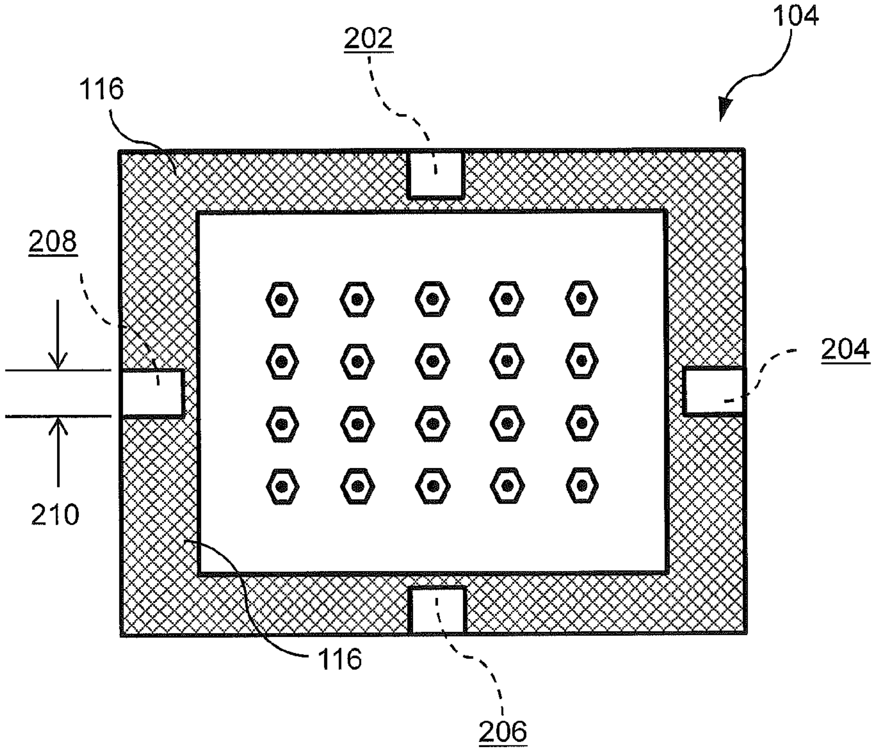
FIG. 2 illustrates a schematic a top-down view of a semiconductor structure of a wafer according to an embodiment of the invention.

Referring now to the drawings, FIGS. 1-2 illustrates a schematic view of a semiconductor structure of a micro-electro-mechanical-system (MEMS) device 100 with a two-wafer construct including a top wafer 102 and a bottom or base wafer 104 that cooperatively enclose a cavity 138 that defines a vacuum chamber after bonding the wafers 102, 104 to each other. In embodiments, the semiconductor device 100 including the two-wafer construct may also be constructed from a single wafer construct and the schematic view depicted of semiconductor structure of device 100 is substantially similar to the schematic view of a single-wafer construct Particularly, as shown in FIG. 1, a two-wafer construct includes the bottom wafer 104 includes a silicon substrate 106 such as, for example, silicon or highly doped silicon that provides a base of material for forming the plurality of emission sources 108 that are substantially similar. The silicon substrate 106 includes a generally rectangular first portion 107 that terminates into a second generally rectangular portion 109. The first portion 107 has a length 112 of about 1 millimeter (mm) to about 5 millimeter (mm), although, in another embodiment, the length 112 may be in the range of about 5 mm to about 10 mm. The second portion 109 includes emission sources 108 formed on its top surface within the ionization region 110 for producing ionization radiation. The ionization region 110 has a length 114, in one example, of about 7 mm and, in another example, may be in the range of about 5 mm to about 10 mm. In one embodiment, the emission sources 108 are silicon microneedle structures (i.e., nano-emitters) having an aspect ratio of at least greater than 2:1. In another embodiment, the emission sources 108 may be black silicon having needle structures for producing ionization radiation and may be formed by a deep reactive ion etch (DRIE) process during wafer fabrication. The microneedle structures in device 100 are generally tapered from the tip and is formed through an anisotropic chemical etch with potassium hydroxide (KOH) or Tetramethylammonium Hydroxide (TMAH) during device fabrication, as is shown and described below with reference to FIGS. 3A-3I.

Also shown, in one embodiment, bottom wafer 104 includes an insulating oxide layer 116 of a thickness of about 60 micrometer (μm) such as, for example, a silicon dioxide ($SiO_2$) layer that is formed over the silicon substrate 106, however, a nitride layer of about 60 μm may also be used without departing from the scope of the invention. The oxide layer 116 facilitates bonding the top wafer 102 to the bottom wafer 104 while maintaining the electrical insulation between the wafers 102, 104. In operation, the plurality of emission sources 108 produce ionizing radiation (e.g., electrons) from the tip of the microneedle structures due to their nanometer scale tip radius upon the application of a high DC voltage to the emission sources 108.

Also shown in FIG. 1, top wafer 102 includes a silicon substrate 118 such as, for example, silicon or highly doped silicon that provides a base of material for establishing ionization windows 142, 144 having a plurality of transmission membranes or window layers 126, 128 that are substantially similar. Particularly, the substrate 118 includes a plurality of side walls 119 that are coupled to generally horizontal portion 117 containing a plurality of support members such as, for example, support members 120, 122, 124 that are substantially similar. Also, membranes 126, 128 are made of silicon nitride and are supported in the plurality of support members 120, 122, 124. The membranes 126, 128 facilitate passage of ionizing radiation such as electrons or x-rays caused by emission of electrons from the tips of the emission sources 108 to pass through the membranes 126, 128 so that they can ionize gas outside the device 100 within a detector device (not shown). In one embodiment, the windows 126, 128 have a width 130 of about 10 μm and a thickness 132 of about 50 nanometer (nm). In other embodiments, the width 130 may be in the range of about 5 μm to about 500 μm and the thickness 132 may be in the range of about 50 nm to about 500 nm. Further, in one non-limiting example, the distance 134 from the tip of microneedles to the window is about 60 μm, although, in other example, the distance 134 may be in the range of about 50 μm to about 200 μm. Also, the top wafer 102 includes an insulating oxide layer 136 of a thickness of about 60 μm such as, for example, a silicon dioxide ($SiO_2$) layer that is formed along the interior and bottom surfaces of the silicon substrate 118, however, a nitride, spin on glass (SOG) or other deposited dielectric layer of about 60 μm may also be used without departing from the scope of the invention. The oxide layer 136 facilitates bonding of the top wafer 102 to the bottom wafer 104 while maintaining an electrical insulation between the wafers 102, 104. In operation, top wafer 102 is coupled to the bottom wafer 104 and air or gas is evacuated from the cavity 138 prior to bonding them together along the oxide layers 116, 136. Further, upon applying a high DC voltage to the emission sources 108, a very-high electric field near the nanometer scale tips of the microneedle structures is generated that promotes electrons from, in one example, to emanate from the tips. The electrons accelerate through the vacuum chamber 134 and towards the membranes 126, 128. Some electrons pass through the membranes 126, 128 so that they are useful in ionizing gas within a detector device while other electrons strike the membranes 126, 128 and create x-rays that are useful in producing a wide spectrum of light, from the ultraviolet to the long wave infrared. It is to be appreciated that a description of ionization of device 100 provides an adequate description of ionization of black silicon.

Further, as shown particularly with reference to FIG. 2, bottom wafer 104 includes a plurality of pump-out ports 202, 204, 206, 208 that define cavity locations in the insulating oxide layer 132. The pump-out ports 202-208 have a width 210 of about 50 μm, but may be in the range of about 20 μm to about 100 μm. The width 210 of ports 202-208 does not extend to the inside edge 116 and thereby facilitates vacuum evacuation of the chamber 134 (FIG. 1) while maintaining the electrical isolation between the top wafer 102 and the bottom wafer 104.

Figure 3A:
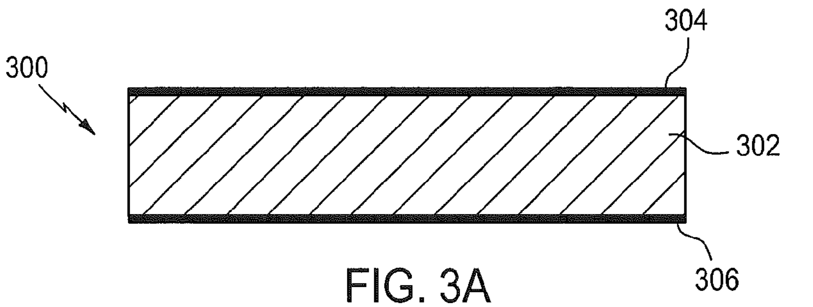
FIG. 3A schematically illustrates a cross-sectional view of the bottom wafer of FIG. 1 showing oxidation layers deposited on its surfaces according to an embodiment of the invention.
Figure 3B:
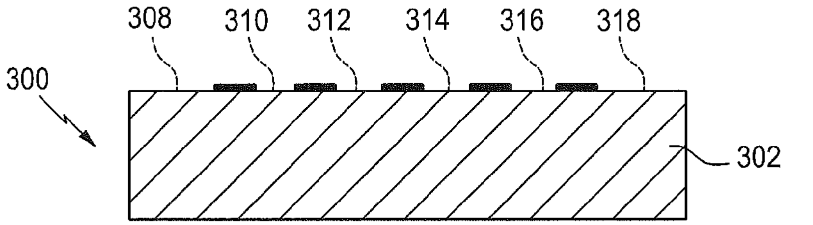
FIG. 3B schematically illustrates the wafer of FIG. 3A in a condition during a later stage of the example process including etching according to an embodiment of the invention.
Figure 3C:
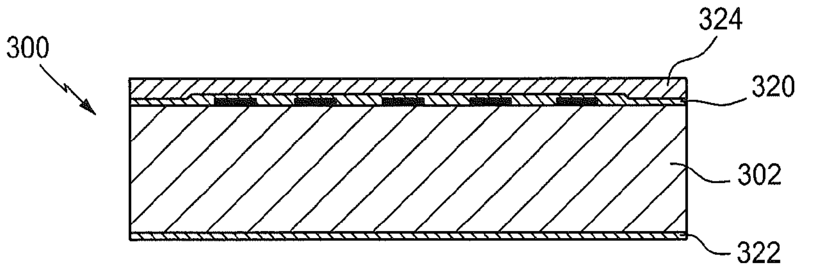
FIG. 3C schematically illustrates the wafer of FIG. 3A in a condition during a later stage of the example process including chemical vapor deposition according to an embodiment of the invention.

As best shown in FIGS. 3A-3I, an exemplary method of making a bottom wafer 104 including the microneedle structures as the emission sources 108 of a two-wafer construct is shown according to an embodiment of the invention. Particularly, as shown in FIG. 3A, the example method includes starting with a wafer 300 such as, for example, silicon that is substantially planar. This particular example includes a silicon layer 302, about a 500 nm oxidation layer 304 on the upper side or surface (according to the drawings), and about a 500 nm oxidation layer 306 on the back side or surface (according to the drawings). The oxidation layers 304, 306 can include nitride layers in another embodiment. In FIG. 3B, the back side is wet etched to remove the oxidation layer 306 (FIG. 3A) while the upper side is selectively dry-etched using, in one example, a photoresistive process to define cavities 308-318 for the ionization region 110 (FIG. 1). At this point, in FIG. 3C, about 100 nm nitride layers 320, 322 are deposited on the upper and back sides using, for example, a method such as plasma enhanced chemical vapor deposition (PECVD). An additional oxide layer 324 of about 4 μm is deposited over the nitride layer 320 using, in one example, a low pressure chemical vapor deposition (LPCVD).

Figure 3D:
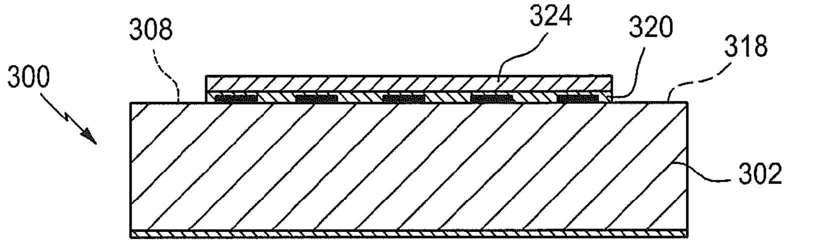
FIG. 3D schematically illustrates the wafer of FIG. 3A in a condition during a later stage of the example process including pattern and etch for a mesa pattern according to an embodiment of the invention.
Figure 3E:
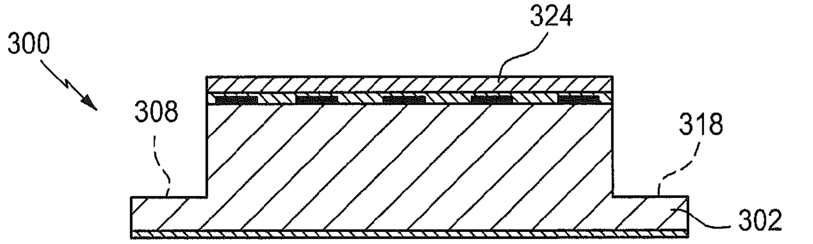
FIG. 3E schematically illustrates the wafer of FIG. 3A in a condition during a later stage of the example process including deep reactive ion etch according to an embodiment of the invention.
Figure 3F:
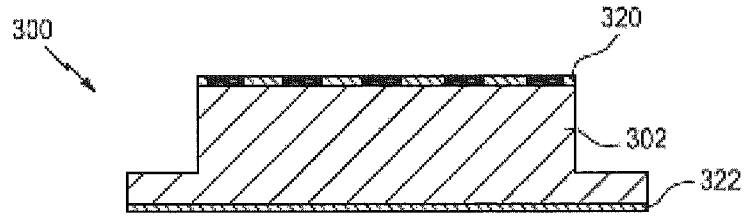
FIG. 3F schematically illustrates the wafer of FIG. 3A in a condition during a later stage of the example process including wet etching according to an embodiment of the invention.

After depositing the oxide and nitride layers 320, 322, 324 (FIG. 3C), a selective mask layer is lithographically patterned and etched to selectively remove the oxide layer 324 and the nitride layer 320 (FIG. 3C) in order to define a mesa pattern that extends to the upper side of the silicon 302, as shown in FIG. 3D. At this point, as shown in FIG. 3E, a deep reactive ion etch (DRIE) is used to deepen the mesa pattern to a depth of about 400 μm and produce vertical sidewalls. In FIG. 3F, once the vertical sidewalls have been established, the oxide layer 324 (FIG. 3E) is removed by using a liquid-phase ("wet") etch process such as, for example, a back-oxide etch (BOE) while retaining the nitride layers 320, 322. The wet etch process is effective as an etch stop for the etching technique used to remove the oxide layer 324 and retain the oxide layer 320.

Figure 3G:
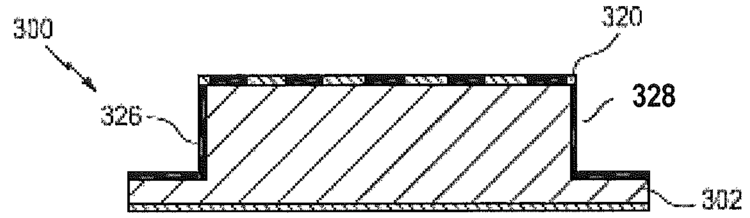
FIG. 3G schematically illustrates the wafer of FIG. 3A in a condition during a later stage of the example process including thermal oxidation according to an embodiment of the invention.
Figure 3H:
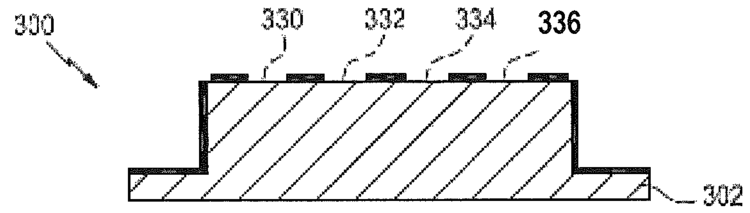
FIG. 3H schematically illustrates the wafer of FIG. 3A in a condition during a later stage of the example process including wet etching according to an embodiment of the invention.
Figure 3I:
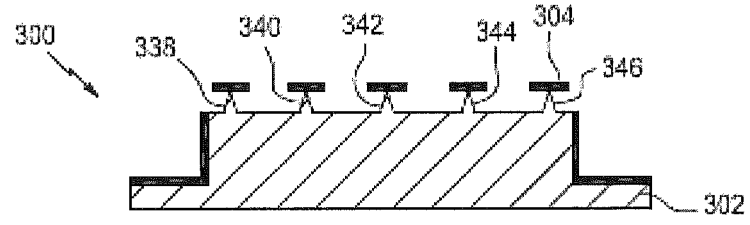
FIG. 3I schematically illustrates the wafer of FIG. 3A in a condition during a later stage of the example process including anisotropic etching according to an embodiment of the invention.

At this point, as shown in FIG. 3G, about 1.5 μm oxidation layers 326, 328 are deposited on the bare silicon 300 using, for example, a thermal oxidation process and, in FIG. 3H, the nitride layer 320 (FIG. 3G) is removed by using, for example, a hot phosphoric acid wet etch process to define cavities 330-336. The oxidation layers 326, 328 are effective as an etch stop for the etching technique used to remove the nitride layer 320. In FIG. 3I, the microneedles 338-346 are formed by etching the upper side using, for example, a known anisotropic etching technique such as, for example, TMAH or potassium hydroxide (KOH) to create the high-aspect ratio microneedles 338-346. The oxidation layer 304 may be removed using, in one example, a back-oxide etch (BOE).

Figure 4A:
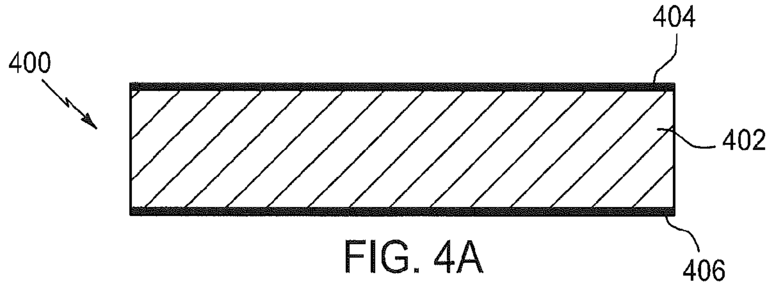
FIG. 4A schematically illustrates a cross-sectional view of a bottom wafer showing oxidation layers deposited on its surfaces according to an embodiment of the invention.
Figure 4B:
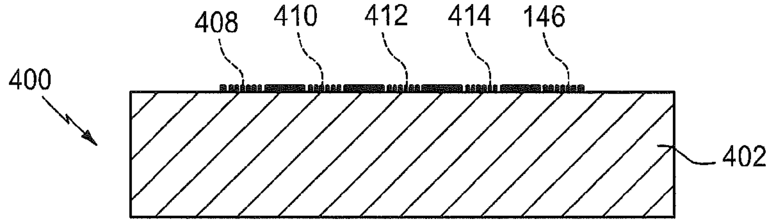
FIG. 4B schematically illustrates the wafer of FIG. 4A in a condition during a later stage of the example process including wet etching according to an embodiment of the invention.
Figure 4C:
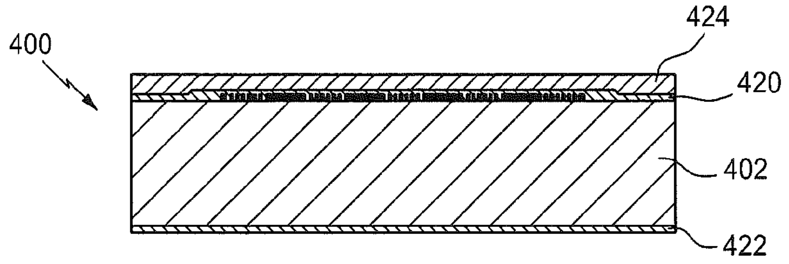
FIG. 4C schematically illustrates the wafer of FIG. 4A in a condition during a later stage of the example process including chemical vapor deposition according to an embodiment of the invention.
Figure 4D:
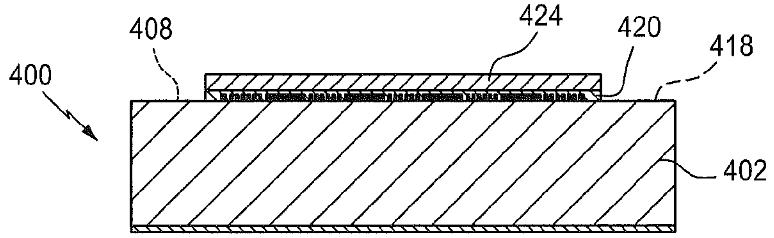
FIG. 4D schematically illustrates the wafer of FIG. 4A in a condition during a later stage of the example process including etching according to an embodiment of the invention.
Figure 4E:
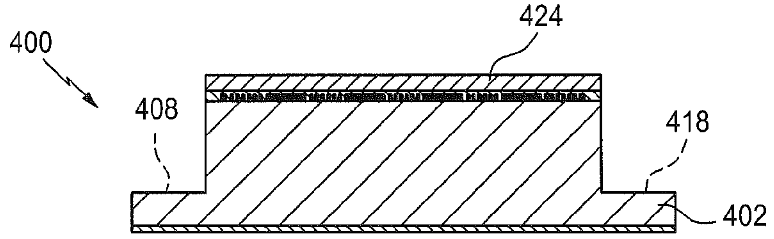
FIG. 4E schematically illustrates the wafer of FIG. 4A in a condition during a later stage of the example process including deep reactive ion etching according to an embodiment of the invention.
Figure 4F:
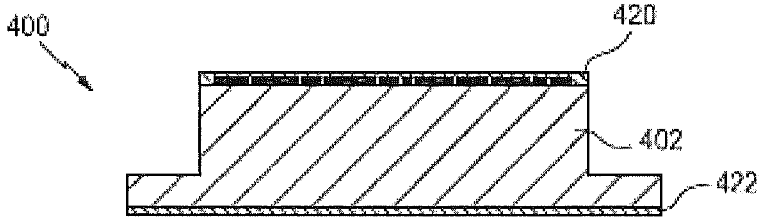
FIG. 4F schematically illustrates the wafer of FIG. 4A in a condition during a later stage of the example process including wet etching according to an embodiment of the invention.
Figure 4G:
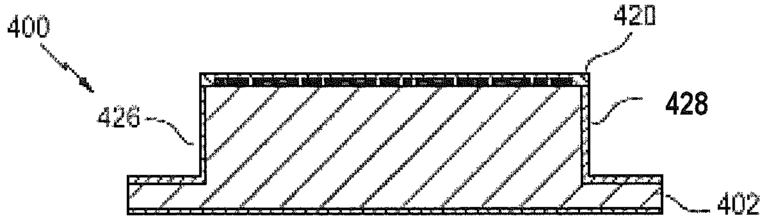
FIG. 4G schematically illustrates the wafer of FIG. 4A in a condition during a later stage of the example process including thermal oxidation according to an embodiment of the invention.
Figure 4H:
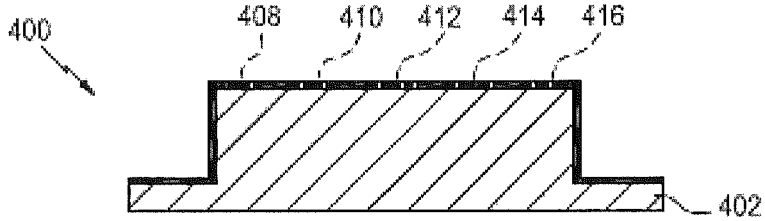
FIG. 4H schematically illustrates the wafer of FIG. 4A in a condition during a later stage of the example process including wet etching according to an embodiment of the invention.
Figure 4I:
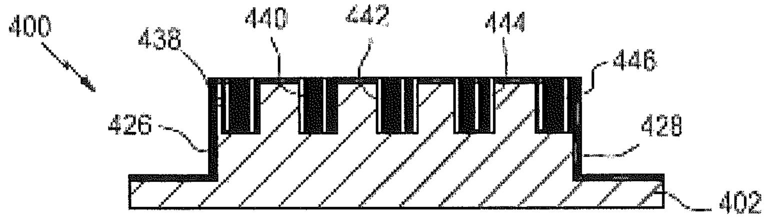
FIG. 4I schematically illustrates the wafer of FIG. 4A in a condition during a later stage of the example process including deep reactive ion etching according to an embodiment of the invention.

As best shown in FIGS. 4A-4I, an exemplary method of making a bottom wafer 104 comprising black silicon including needle structures as the emission sources 108 of a two-wafer construct is shown according to an embodiment of the invention. Particularly, as shown in FIG. 4A, the example method includes starting with a wafer 400 such as, for example, silicon that is substantially planar. This particular example includes a silicon layer 402, about a 500 nm oxidation layer 404 on the upper side (according to the drawings), and about a 400 nm oxidation layer 306 on the back side (according to the drawings). The oxidation layers 404, 406 can include nitride layers in another embodiment. In FIG. 4B, the back side is wet etched using a liquid-wet etch process to remove the oxidation layer 406 (FIG. 4A) while the upper side is lithographically patterned and selectively etched using a photoresistive process to define black silicon 408-416 for the ionization region 110 (FIG. 1). At this point, in FIG. 4C, about 100 nm nitride layers 420, 422 are deposited on the upper and back sides using, for example, a method such as plasma enhanced chemical vapor deposition (PECVD). An additional oxide layer 424 of about 4 nm is deposited over the nitride layer 420 using, in one example, a low pressure chemical vapor deposition (LPCVD). After depositing the oxide and nitride layers 420, 422, 424 (FIG. 4C), a mask layer is selectively deposited and etched to selectively remove the oxide layer 424 and the nitride layer 420 (FIG. 4C) in order to define a mesa pattern that extends to the upper side of the silicon 402, as shown in FIG. 4D. At this point, as shown in FIG. 4E, a deep reactive ion etch (DRIE) is used to deepen the mesa pattern to a depth of about 400 nm and produce vertical sidewalls. In FIG. 4F, once the vertical sidewalls have been established, the oxide layer 424 (FIG. 4E) is removed by using a wet etch process such as, for example, a back-oxide etch (BOE) while retaining the nitride layers 420, 422. The wet etch process is effective as an etch stop for the etching technique used to remove the oxide layer 424 and retain the oxide layer 420. At this point, as shown in FIG. 4G, about 1.5 nm oxidation layers 426, 428 are deposited on the bare silicon 400 using, for example, a thermal oxidation process and, in FIG. 4H, the nitride layer 420 (FIG. 4G) is removed by using, for example, a hot phosphoric acid wet etch process to expose the black silicon 408-416 for further processing. In FIG. 4I, the black silicon 408-416 (also referred to as nanograss") is deepened by etching the upper side using a known etching technique using, for example, a deep reactive ion etch (DRIE). In one embodiment, the oxidation hard mask 426, 428 may be removed using, in one example, a back-oxide etch (BOE).

Figure 5A:
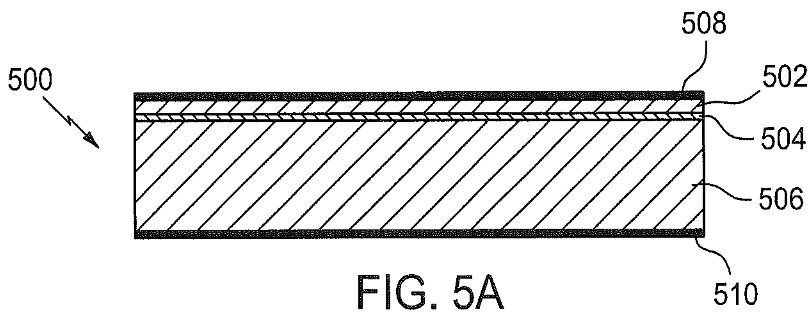
FIG. 5A schematically illustrates a cross-sectional view of the top wafer of FIG. 1 showing a three layer wafer according to an embodiment of the invention.
Figure 5B:
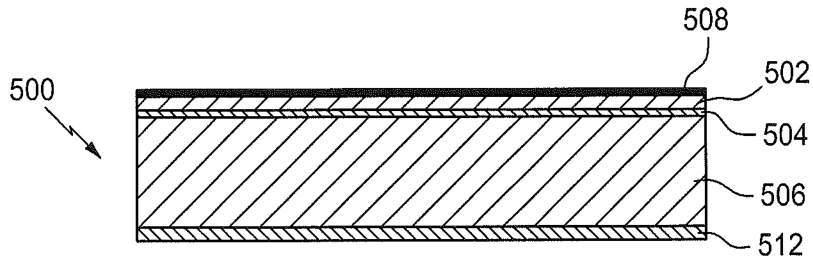
FIG. 5B schematically illustrates the wafer of FIG. 5A in a condition during a later stage of the example process including a dry-etching according to an embodiment of the invention.
Figure 5C:
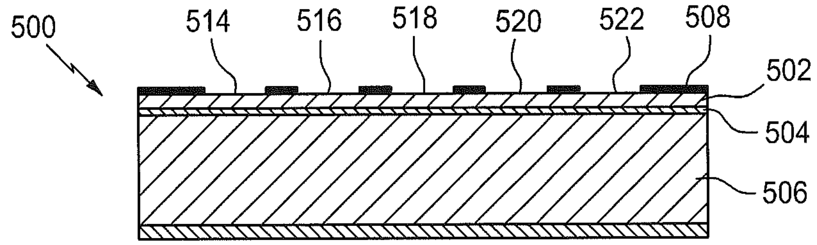
FIG. 5C schematically illustrates the wafer of FIG. 5A in a condition during a later stage of the example process including dry-etching according to an embodiment of the invention.
Figure 5D:
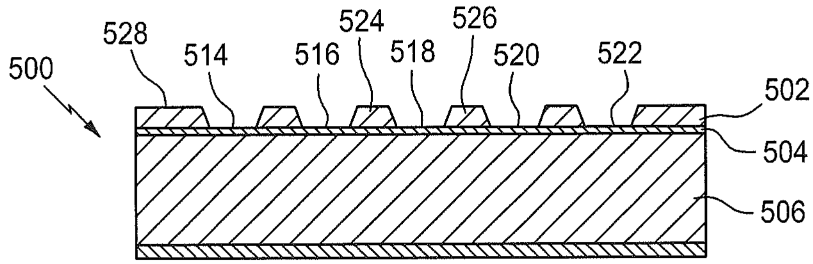
FIG. 5D schematically illustrates the wafer of FIG. 5A in a condition during a later stage of the example process including wet etching according to an embodiment of the invention.

Referring to FIGS. 5A-5G, an example method of making the top wafer 102 (FIG. 1) having the transmission membranes in the ionization windows 142, 144 (FIG. 1) such as, for example, transmission membrane 126 includes starting with a wafer as schematically shown in FIG. 5A. In this example, the wafer 500 comprises silicon-insulator-silicon (SOI) and includes, in this example, a silicon layer 502, an insulator layer 504 such as, for example, silicon oxide, and a silicon layer 506. This is a known three-layer wafer having about a 5 μm to about a 50 μm layer of silicon 502, about a 1 μm oxide layer 504, and about a 300 μm silicon layer 506. In another embodiment, an oxide of beryllium may be used for the oxide layer 504 without departing from the scope of the invention. In this example, a hard mask material of about 100 nm nitride layers 508, 510 are deposited on both sides (the upper and back side according to the drawing) using, in one example, low pressure chemical vapor deposition (LPCVD). At this point, as shown in FIG. 5B, the 100 nm nitride layer 510 (FIG. 5A) is removed from the back side by using a dry-etch process and about a 2 μm oxidation layer 512 is deposited on the silicon 506 using, for example, a thermal oxidation process. In FIG. 5C, the front side is selectively dry-etched using, in one example, a photoresistive process to define windows 514-522 in the hard mask nitride layer 508. In FIG. 5D, the upper side is wet etched using a pattern to establish the windows 514-522 for defining the transmission membranes such as, for example, transmission membrane 126 (FIG. 1) using a known anisotropic etching technique such as TMAH or KOH. The nitride layer 508 (FIG. 5C) is effective as an etch stop for the etching technique used to establish the windows 514-522. At this point, the nitride layer 508 (FIG. 5C) is removed from the upper side by using, for example, a hot phosphoric acid wet etch process. An example result of the process is schematically shown in FIG. 5D. In this example, upper side of the wafer 500 includes sloped side surfaces 524 and upper side 528 of support members 526.

Figure 5E:
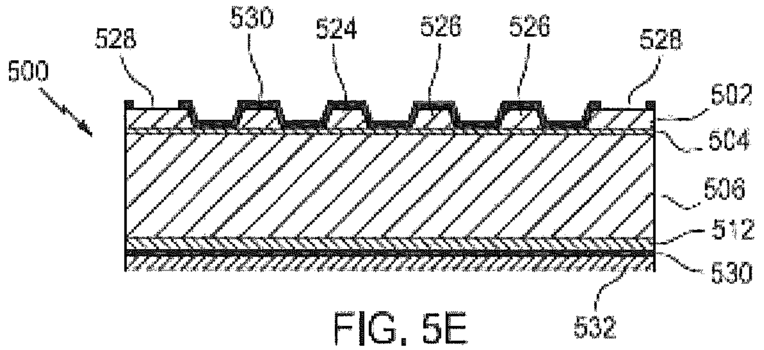
FIG. 5E schematically illustrates the wafer of FIG. 5A in a condition during a later stage of the example process including chemical vapor deposition according to an embodiment of the invention.

In FIG. 5E, about a 50 nm nitride layer 530, in one example, is applied to coat the upper side 528, the back side, the windows 514-522 (FIG. 5D), and the side surfaces 524 using a LPVCD process. Other example materials may include beryllium, carbon, graphite, boron nitride, aluminum, titanium, silicon nitride, silicon dioxide, aluminum oxide, magnesium oxide, silicon carbide, silicon oxynitride, silicon carbonitride, beryllium oxide, an ultra-nonocrystalline diamond or a combination of dielectric materials having low atomic weight. Given this description, those skilled in the art will realize which of those materials will best meet the needs of their particular situation. The selected material or combination of such materials should provide for consistent conformity between the windows 514-522 (FIG. 5D) and the support members 526, consistent thickness of the windows 514-522 (FIG. 5D) across the ionization windows 142, 144 (FIG. 1), high transmission of the ionizing radiation (e.g., electrons or x-rays) and sufficient strength to withstand the high pressure differential across the ionization windows 142, 144 (FIG. 1). At this point, the upper side 528 (FIG. 5E) is selectively dry-etched up to the silicon layer 502 to remove the nitride layer 530 at selective support members 526 define top contacts at the exposed silicon 502. Also, a hard mask of about a 4 μm oxide layer 532 is deposited on the back side over the nitride layer 530 using, for example, a PECVD process.

Figure 5F:
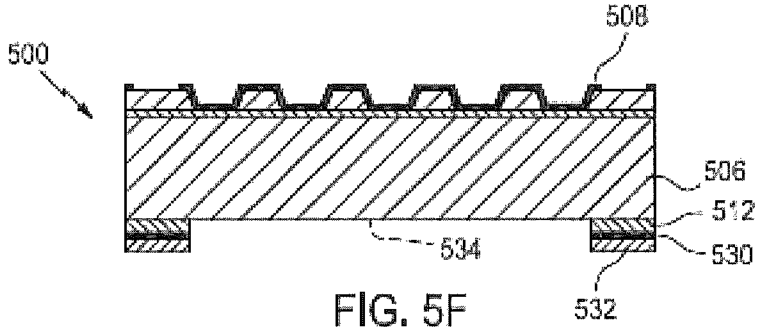
FIG. 5F schematically illustrates the wafer of FIG. 5A in a condition during a later stage of the example process including dry etching to form a cavity according to an embodiment of the invention.
Figure 5G:
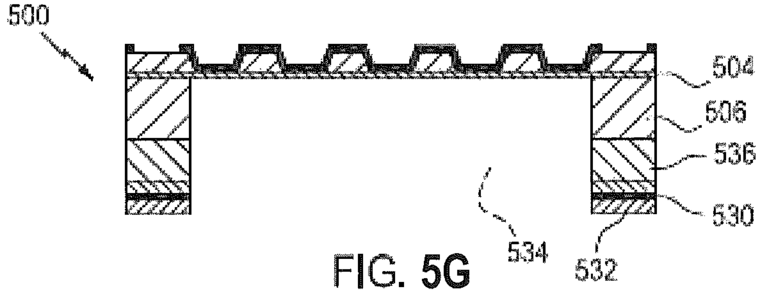
FIG. 5G schematically illustrates the wafer of FIG. 5A in a condition during a later stage of the example process including deep reactive ion etching according to an embodiment of the invention.
Figure 5H:
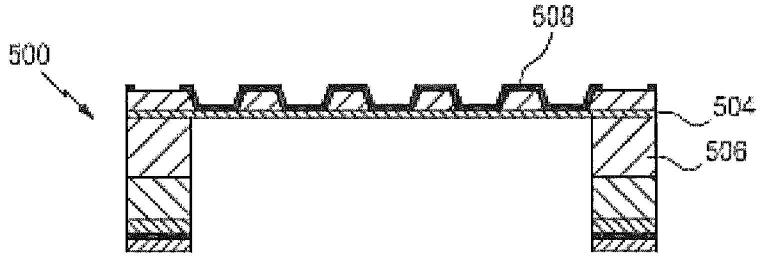
FIG. 5H schematically illustrates the wafer of FIG. 5A in a condition during a later stage of the example process including back oxide etching according to an embodiment of the invention.

Once the oxide layer 532 (FIG. 5E) has been deposited, a portion of the wafer 506 can be removed in order to establish a cavity 534. Particularly, a cavity 534 is formed on the backside of wafer 500 through which electrons may be transmitted, as is shown in FIG. 5F. One example includes applying a mask to the back side and dry-etching the back side to selectively remove the oxidation layer 512, the nitride layer 530, and the oxide layer 532 and form the cavity 534. In an embodiment, a pumping channel is also drawn on the mask prior to the dry-etching process to form the cavity 534. At this point, as shown in FIG. 5G, a DRIE technique is used to etch the silicon 506 up to oxide layer 504 in order to define the cavity 534 and produce the vertical sidewalls. Also, the pumping channels 536 are etched using an aspect ratio dependent etching (ARDE) technique to define shallow depths in the pumping channels 536. As schematically shown in FIG. 5G, the oxide layer 504 is exposed and still adjacent the nitride layer 508, which defines the transmission membrane 126 (FIG. 1).

As shown in FIG. 5G, the oxide layer 504 is stripped by using a wet-etch process such as, for example, a BOE while retaining the nitride layer 508 defining the transmission membrane. Also, the BOE technique is used to remove the hard mask oxide layer 532 (FIG. 5E). One example includes using a buffered hydrofluoric acid etching technique for removing the layers 504, 532. The resulting ionization window 142 shown in FIG. 1 is structurally sound enough to withstand the high pressure differential across the window 142 that will be required in many devices that incorporate such an ionization window. At the same time the window 142 (FIG. 1) can be made small enough to be incorporated into a miniaturized device configuration and provides for efficient transmission of the ionizing radiation.

In another embodiment, a MEMS device made from a single silicon wafer construct includes a bottom wafer with emission sources that may be formed as shown and described above with reference to either FIGS. 3A-3I or 4A-4I. Also, a cavity that is substantially similar to cavity 138 (FIG. 1) may be built by depositing a sacrificial dielectric such as silicon oxide above the bottom wafer that will later be removed through chemical etching such as buffered hydrofluoric acid (BHF). At this point, an electrically insulation region is created at selective locations over the sacrificial dielectric layer by means of deposition but that will not be attached by the BHF. Also, a membrane structure such as silicon nitride, poly-silicon, or other material is grown over the dielectric to create the window and support structure. On the back side of the bottom wafer, a port is opened to access the cavity by using a chemical etch technique with TMAH or KOH as an anisotropic silicon etch. The port also serves as a vacuum evacuation port. At this point, dielectric is dissolved such as, for example, with BHF to create the cavity region. Further, after cavity air evacuation and packaging and/or refill, the port is closed with a vacuum plug.

The technical effects and benefits of exemplary embodiments include a method for manufacturing a MEMS based ionization source having a single silicon wafer or two-silicon wafers. In an embodiment, a two-wafer approach includes a bottom wafer with a plurality of emission sources and a top wafer having a transmission membrane.

The terminology used herein is for the purpose of describing particular embodiments only and is not intended to be limiting of the invention. While the description of the present invention has been presented for purposes of illustration and description, it is not intended to be exhaustive or limited to the invention in the form disclosed. Many modifications, variations, alterations, substitutions, or equivalent arrangement not hereto described will be apparent to those of ordinary skill in the art without departing from the scope and spirit of the invention. Additionally, while the various embodiment of the invention have been described, it is to be understood that aspects of the invention may include only some of the described embodiments. Accordingly, the invention is not to be seen as limited by the foregoing description, but is only limited by the scope of the appended claims.

The invention claimed is:

1. A microelectromechanical system (MEMS) assembly comprising:

at least one emission source;

a top wafer having a plurality of side walls and a horizontal portion, the horizontal portion having a thickness between a first side and a directly opposed second side, at least one window in the horizontal portion extending between the first and second sides and a transmission membrane across the at least one window; and a bottom wafer having a first portion with a first planar surface, an intermediate surface directly opposed to the first planar surface, a second portion with a second planar surface, the at least one emission source provided on the second planar surface;

wherein the top wafer bonds to the bottom wafer at the intermediate surface and encloses a cavity within the top wafer and the bottom wafer;

wherein the at least one emission source includes microneedles formed on the bottom wafer, the microneedles being of the same material as the bottom wafer.

2. A microelectromechanical system (MEMS) assembly comprising:

at least one emission source;

a top wafer having a plurality of side walls and a horizontal portion the horizontal portion having a thickness between a first side and a directly opposed second side, at least one window in the horizontal portion extending between the first and second sides and a transmission membrane across the at least one window; and a bottom wafer having a first portion with a first planar surface, an intermediate surface directly opposed to the first planar surface, a second portion with a second planar surface, the at least one emission source provided on the second planar surface;

wherein the top wafer bonds to the bottom wafer at the intermediate surface and encloses a cavity within the top wafer and the bottom wafer;

wherein the bottom wafer includes an oxide layer deposited on the intermediate surface.

3. The assembly of claim 1, wherein the transmission membrane comprises at least one of beryllium, carbon, boron nitride, aluminum, titanium, silicon dioxide, aluminum oxide, magnesium oxide, silicon carbide, silicon carbonitride, silicon nitride, silicon oxynitride, beryllium oxide, and ultra-nanocrystalline diamond.

4. The assembly of claim 1, wherein the top wafer comprises silicon.

5. A microelectromechanical system (MEMS) assembly comprising:

at least one emission source;

a top wafer having a plurality of side walls and a horizontal portion, the horizontal portion having a thickness between a first side and a directly opposed second side, at least one window in the horizontal portion extending between the first and second sides and a transmission membrane across the at least one window; and a bottom wafer having a first portion with a first planar surface, an intermediate surface directly opposed to the first planar surface a second ortion with a second planar surface, the at least one emission source provided on the second planar surface;

wherein the top wafer bonds to the bottom wafer at the intermediate surface and encloses a cavity within the top wafer and the bottom wafer;

wherein the top wafer comprises a silicon-on-insulator wafer having silicon on opposite sides of an oxide.

6. The assembly of claim 1, wherein the at least one window has a progressively increasing width from the first side to the second side and wherein the second width is the largest width of the window.

7. The assembly of claim 1, wherein the horizontal portion comprises a plurality of support members and a plurality of windows between support members, each support member having side surfaces facing toward an adjacent one of the windows.

8. The assembly of claim 7, wherein the transmission membrane comprises a continuous coating over the first side of the horizontal portion.

9. The assembly of claim 1, wherein the transmission membrane maintains a pressure difference between a pressure on an interior surface of the transmission membrane near the first side and an outer surface of the transmission membrane that is directly opposed to the first side.

10. The assembly of claim 1, wherein the intermediate surface includes at least one vacuum port that is configured for evacuating air from the cavity.

11. The assembly of claim 1, wherein the transmission membrane facilitates passage of ionizing radiation from the emission source to ionize gas outside the second side.

* * * * *